(12) United States Patent
Pamulaparthy et al.

(10) Patent No.: US 12,578,399 B2
(45) Date of Patent: Mar. 17, 2026

(54) SYSTEMS AND METHODS FOR MONITORING A THROUGH FAULT CURRENT

(71) Applicant: General Electric Technology GmbH, Baden (CH)

(72) Inventors: Balakrishna Pamulaparthy, Hyderabad (IN); Elm Costa i Bricha, Lisburn (GB); Bryan McKibbin, Glarryford (IE)

(73) Assignee: GE VERNOVA INFRASTRUCTURE TECHNOLOGY LLC, Greenville, SC (US)

( * ) Notice: Subject to any disclaimer, the term of this patent is extended or adjusted under 35 U.S.C. 154(b) by 396 days.

(21) Appl. No.: 18/310,232

(22) Filed: May 1, 2023

(65) Prior Publication Data

US 2024/0369646 A1 Nov. 7, 2024

(51) Int. Cl.
*G01R 31/62* (2020.01)
*G01R 31/12* (2020.01)
*G01R 35/02* (2006.01)
*G05B 19/042* (2006.01)
*G06F 18/214* (2023.01)
*G06N 20/00* (2019.01)

(52) U.S. Cl.
CPC ............. *G01R 31/62* (2020.01); *G06N 20/00* (2019.01)

(58) Field of Classification Search
CPC ........ G01R 31/62; G01R 31/12; G01R 35/02; G06N 20/00; G06F 18/214; G05B 19/0428
USPC .......................................................... 702/58
See application file for complete search history.

(56) References Cited

U.S. PATENT DOCUMENTS

2009/0091867 A1* 4/2009 Guzman-Casillas .. H02H 7/045
                                                        361/35
2022/0271527 A1* 8/2022 Bishop ................... H02H 3/006

FOREIGN PATENT DOCUMENTS

CA        2503472 A1     8/1999
CN      111596168 A      8/2020
CN      111988192 A     11/2020
        (Continued)

OTHER PUBLICATIONS

English translation of CN 112271693, Dec. 2, 2022. (Year: 2022).*

(Continued)

*Primary Examiner* — Michael P Nghiem
(74) *Attorney, Agent, or Firm* — Eversheds Sutherland (US)

(57) ABSTRACT

The present application provides a method for monitoring a through fault current. The method may involve: detecting a through fault; calculating an electrical stress, peak current, and duration of the through fault; determining two sets of percentage state changes associated with the through fault; assigning a respective set of weights and criticalities to each set of percentage state changes; calculating a mechanical state change based on the first set of percentage state changes and the first set of weights and criticalities; calculating a thermal state change based on the second set of percentage state changes and the second set of weights and criticalities; calculating a cumulative state change based on the mechanical and thermal state changes; and training a machine learning model using the electrical stress, peak current, duration, two sets of percentage state changes, and mechanical, thermal, and cumulative state changes.

20 Claims, 4 Drawing Sheets

(56)           References Cited

FOREIGN PATENT DOCUMENTS

| CN | 114152825 | A | * | 3/2022 | ............. | G01R 31/62 |
| CN | 112271693 | B | * | 12/2022 | ............. | H02H 3/006 |

OTHER PUBLICATIONS

English translation of CN 114152825, Mar. 8, 2022. (Year: 2022).*
Tripathi et al., "Discrimination of magnetic inrush current from fault current in transformer", International Journal of Pure and Applied Mathematics, vol. 114, No. 12, p. 615-625 (2017).
Wang et al., "A New Principle of Discrimination between Inrush Current and Internal Fault Current of Transformer Based on Self-Correction Function", 7th International Power Engineering Conference (2005).
Hartmann, "Transformer Protection", 35th Annual Hands-on Relay School, p. 140-141, 2018.
"Inrush Restrain for Transformer Differential Protection with Current Waveform Analysis (CWA) in SIPROTEC 7UT6x", Siemens, 2020.
International Search Report and Written Opinion for PCT/US2024/025946, dated Nov. 14, 2024, 7 pages.

* cited by examiner

SYSTEMS AND METHODS FOR MONITORING A THROUGH FAULT CURRENT

TECHNICAL FIELD

The present application and the resultant patent relate generally to power transformer systems and more particularly relate to systems and methods for monitoring through fault currents in power transformer systems.

BACKGROUND

Generally described, a through fault is a system fault in a power transformer system that is external to the protection zone associated with the power transformer. The protection zone for a power transformer differential relay may be defined by the location of the secondary circuit of the current transformers. Through faults may subject a power transformer to electrical and mechanical stresses, which may then degrade the insulation and the mechanical strength of the power transformer. The damage to the power transformer may depend on the magnitude and the duration of the through fault current.

Accordingly, there is a growing need for a method to accurately monitor through fault currents and accurately assess the impact of the through fault on the condition of the power transformer. Additionally, there is a growing need for a method to evaluate the state change associated with the power transformer after the through fault and to determine if the power transformer is prepared to withstand a subsequent through fault.

SUMMARY

The present application and the resultant patent thus provide a method for monitoring a through fault current. The method may include the steps of: detecting a first occurrence of a first through fault in a power transformer system; calculating a first electrical stress associated with the first through fault, a first peak current associated with the first through fault, and a first duration of the first through fault; determining a first set of percentage state changes associated with the first through fault and a second set of percentage state changes associated with the first through fault; assigning a first set of weights and a first set of criticalities to the first set of percentage state changes; calculating a first mechanical state change based at least in part on the first set of percentage state changes, the first set of weights, and the first set of criticalities; assigning a second set of weights and a second set of criticalities to the second set of percentage state changes; calculating a first thermal state change based at least in part on the second set of percentage state changes, the second set of weights, and the second set of criticalities; calculating a first cumulative state change based at least in part on the first mechanical state change and the first thermal state change; and training a machine learning model using the first electrical stress, the first peak current, the first duration, the first set of percentage state changes, the second set of percentage state changes, the first mechanical state change, and the first cumulative state change.

The present application and the resultant patent further provide a method for monitoring a through fault current. The method may include the steps of: detecting a first occurrence of a first through fault in a power transformer system; calculating a first electrical stress associated with the first through fault, a first peak current associated with the first through fault, and a first duration of the first through fault; determining a first set of percentage state changes associated with the first through fault and a second set of percentage state changes associated with the first through fault; calculating a first mechanical state change based at least in part on the first set of percentage state changes; calculating a first thermal state change based at least in part on the second set of percentage state changes; calculating a first cumulative state change based at least in part on the first mechanical state change and the first thermal state change; and training a machine learning model using the first electrical stress, the first peak current, the first duration, the first set of percentage state changes, the second set of percentage state changes, the first mechanical state change, the first thermal state change, and the first cumulative state change.

The present application and the resultant patent further provide a power transformer system. The power transformer system may include: a power transformer; and a controller, wherein the controller is configured to: detect a first occurrence of a first through fault in the power transformer system; calculate a first electrical stress associated with the first through fault, a first peak current associated with the first through fault, and a first duration of the first through fault; determine a first set of percentage state changes associated with the first through fault and a second set of percentage state changes associated with the first through fault; assign a first set of weights and a first set of criticalities to the first set of percentage state changes; calculate a first mechanical state change based at least in part on the first set of percentage state changes, the first set of weights, and the first set of criticalities; assign a second set of weights and a second set of criticalities to the second set of percentage state changes; calculate a first thermal state change based at least in part on the second set of percentage state changes, the second set of weights, and the second set of criticalities; calculate a first cumulative state change based at least in part on the first mechanical state change and the first thermal state change; and train a machine learning model using the first electrical stress, the first peak current, the first duration, the first set of percentage state changes, the second set of percentage state changes, the first mechanical state change, the first thermal state change, and the first cumulative state change.

These and other features and improvements of this application and the resultant patent will become apparent to one of ordinary skill in the art upon review of the following detailed description when taken in conjunction with the several drawings and the appended claims.

DETAILED DESCRIPTION

Figure 1:
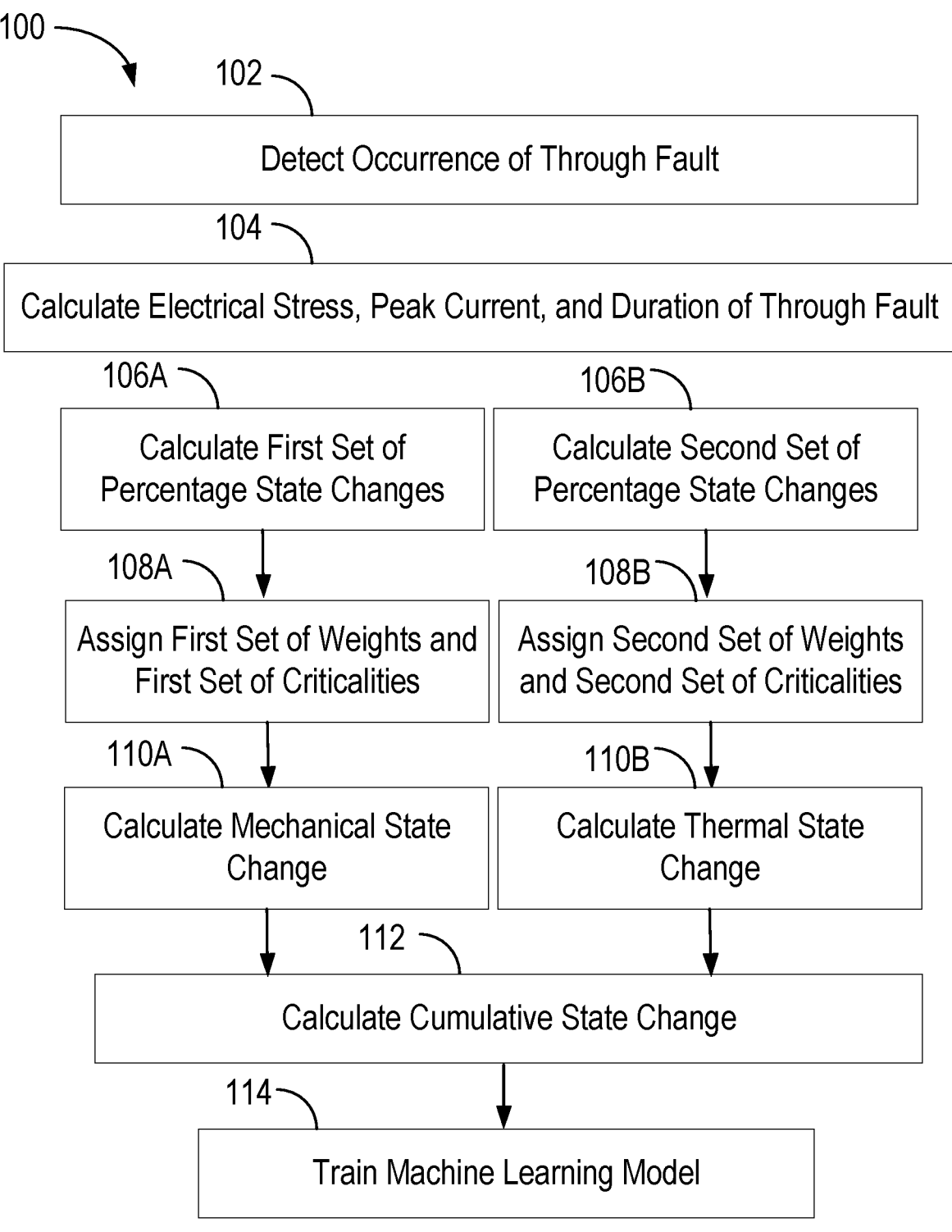
FIG. 1 is a flow chart depicting a method for monitoring a through fault current, in accordance with one or more example embodiments of the disclosure.

Referring now to the drawings, in which like numerals refer to like elements throughout the several views, FIG. 1 is a flow chart 100 of a method for monitoring a through fault current. The flow chart 100 may be applicable to through faults in power transformer systems. At block 102, an occurrence of a through fault in a power transformer system may be detected. The occurrence of the through fault may be identified based at least on a set of circuit breaker statuses associated with the power transformer system. The set of circuit breaker statuses may be associated with the primary, secondary, and/or tertiary sides of the power transformer of the power transformer system. In some instances, the occurrence of the through fault may be identified based at least on a determination that the set of circuit breakers has not tripped and a detection of a high and symmetrical current. The definition of a high current may vary based on the category of the power transformer.

At block 104, an electrical stress associated with the through fault, a peak current associated with the through fault, and a duration associated with the through fault may be calculated. The electrical stress may be a function of the through fault current and the duration of the through fault. The peak current may be calculated for each phase of the three phases of the current associated with the through fault. The start date and time and the end date and time of the through fault may also be recorded. The duration associated with the through fault may then be calculated based on the start date and time and the end date and time. In some instances, the duration may be between 10 milliseconds and 1 second. The through fault current associated with the start date and time and the end date and time of the through fault may also be recorded. The cumulative number of through faults, an accumulated stress associated with the through fault (as a function of the through fault current and the duration of the through fault), and a root mean square current associated with the through fault may be assessed.

At block 106A, a first set of percentage state changes associated with the through fault may be determined. At block 106B, a second set of percentage state changes associated with the through fault may be determined. The first set of percentage state changes may include a percentage state change associated with a dissolved gas analysis of the power transformer system, a percentage state change associated with a rate of change of the power transformer system, a percentage state change associated with a gas ratio associated with the power transformer system, and/or other relevant percentage state changes. The second set of percentage state changes may include a percentage state change associated with a winding hot spot temperature or thermal output of the power transformer system, a percentage state change associated with an aging factor associated with the power transformer system, a percentage state change associated with a loss of life associated with the power transformer system, and/or other relevant percentage state changes.

The determination of the first set of percentage state changes and the second set of percentage state changes may involve the identification of a set of mechanical measurements associated with the power transformer system and a set of thermal measurements associated with the power transformer system. Respective conditions associated with each mechanical measurement of the set of mechanical measurements and each thermal measurement of the set of thermal measurements may be determined. In one example, the respective conditions may be one of a set of predefined conditions. For example, the set of predefined conditions may include Conditions 1, 2, 3, and 4. The respective conditions associated with each mechanical measurement and each thermal measurement may then be used to determine the first set of percentage state changes and the second set of percentage state changes.

At block 108A, a first set of weights and a first set of criticalities may be assigned to the first set of percentage state changes. At block 108B, a second set of weights and a second set of criticalities may be assigned to the second set of percentage state changes. For example, the first set of weights and the second set of weights may include weights ranging from 0.1 to 1.0. In one example, each weight of the first set of weights and the second set of weights may range from 0.1 to 0.3 if a percentage state change of the first set of percentage state changes or the second set of percentage state changes is associated with Condition 1, from 0.3 to 0.5 if the percentage state change is associated with Condition 2, from 0.5 to 0.7 if the percentage state change is associated with Condition 3, and from 0.7 to 1.0 if the percentage state change is associated with Condition 4. In one example, each criticality of the first set of criticalities and the second set of criticalities may range from 0.1 to 1.0.

At block 110A, the first set of percentage state changes, the first set of weights, and the first set of criticalities may be used to calculate a mechanical state change associated with the through fault. In some instances, the mechanical state change may be calculated as follows: (1) multiplying each percentage state change by the applicable weight and again by the applicable criticality, (2) summing up the values obtained in step (2), and (3) dividing the summed value obtained in step (2) by the number of percentage state changes. At block 110B, the second set of percentage state changes, the second set of weights, and the second set of criticalities may be used to calculate a thermal state change associated with the through fault. In some instances, the thermal state change may be calculated as follows: (1) multiplying each percentage state change by the applicable weight and again by the applicable criticality, (2) summing up the values obtained in step (2), and (3) dividing the summed value obtained in step (2) by the number of percentage state changes.

At block 112, a cumulative state change may be calculated based on the mechanical state change and the thermal state change. In some instances, the cumulative state change may be indicative of the impact of the through fault on the health of the power transformer. The cumulative state change may be further calculated based on a third set of weights applied to the mechanical state change and a fourth set of weights applied to the thermal state change. The third set of weights and the fourth set of weights may be associated with past failure history of the power transformer. In some instances, the cumulative state change may be calculated as follows: (1) multiplying the mechanical state change by the third set of weights, (2) multiplying the thermal state change by the fourth set of weights, (3) summing up the values obtained in steps (1) and (2), and (4) dividing the summed value obtained in step (3) by two.

At block 114, a machine learning model may be trained using the electrical stress, the peak current, the duration, the first set of percentage state changes, the second set of percentage state changes, the mechanical state change, the thermal state change, and the cumulative state change. When the machine learning model is being trained, the power transformer system may be configured to be operating in a healthy mode. During the training of the machine learning model, the first set of percentage state changes and the second set of percentage state changes may be correlated with the electrical stress, the peak current, and the duration of the through fault in order to observe healthy behavior for the power transformer.

Figure 2:
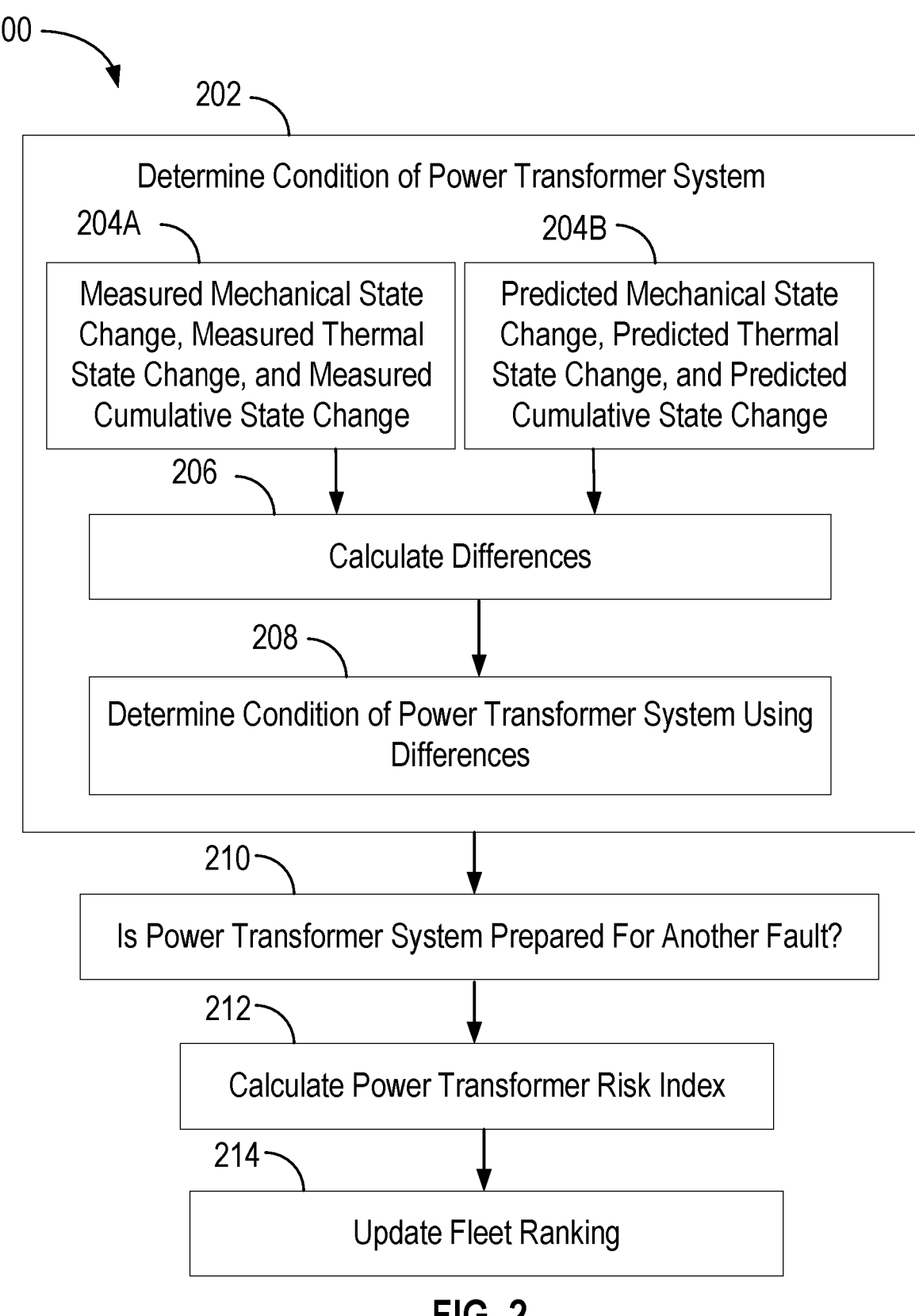
FIG. 2 is a flow chart depicting a method for monitoring a through fault current, in accordance with one or more example embodiments of the disclosure.

FIG. 2 is a flow chart 200 of a method for monitoring a through fault current. At block 202, a condition of the power transformer system may be determined using the machine learning model. The condition of the power transformer system may be determined in light of a subsequent occurrence of another through fault in the power transformer system. When the subsequent through fault is detected, an electrical stress, a peak current, and a duration associated with the subsequent through fault may be calculated. A first set of percentage state changes and a second set of percentage state changes associated with the subsequent through fault may also be determined. At block 204A, a measured mechanical state change and a measured thermal state change associated with the subsequent through fault may be calculated based on the first set of percentage state changes and the second set of percentage state changes. Additionally, at block 204A, a measured cumulative state change may also be calculated using the measured mechanical state change and the measured thermal state change.

At block 204B, the machine learning model may then be used to estimate a predicted mechanical state change, a predicted thermal state change, and a predicted cumulative state change associated with the subsequent thermal fault. At block 206, a first difference between the predicted mechanical state change and the measured mechanical state change may be calculated.

Additionally, at block 206, a second difference between the predicted thermal state change and the measured thermal state change may be calculated. Additionally, at block 206, a third difference between the predicted cumulative state change and the measured cumulative state change may be calculated. At block 208, the first difference, the second difference, and the third difference may then be used to determine the condition of the power transformer system.

At block 210, the condition of the power transformer system may then be used to determine whether or not the power transformer system is prepared for the occurrence of another through fault. In some instances, the degradation caused by the through fault may be calculated, and the risk of allowing the power transformer system to undergo the occurrence of another through fault may be evaluated. An indication of whether the power transformer system is prepared or not may be output to an operator. If the power transformer system is not prepared for the occurrence of another through fault, the indication may include an alarm, a warning, and/or some other indication to the operator. In some instances, the alarm, the warning, and/or the some other indication may indicate the measured cumulative state change and/or the predicted cumulative state change, along with a summary that explains why the power transformer system is not prepared for the occurrence of another through fault. the summary may include an explanation of the sub-systems of the power transformer that may have caused an increased measured cumulative state change and/or predicted cumulative state change. Such a notification system allows an operator to schedule early maintenance to address issues associated with the impacted sub-systems so that the power transformer system may be configured to withstand the occurrence of another through fault.

At block 212, the power transformer risk index may be calculated. In some instances, the power transformer risk index may indicate the power transformer's condition. For example, the power transformer risk index may be on a scale from 1 to 5, with 1 indicating that the power transformer is in good condition, and 5 indicating that the power transformer includes defects that may cause faults. In some instances, the power transformer risk index may impact the sets of weights and criticalities that are used in the calculation of the applicable mechanical state changes, thermal state changes, and cumulative state changes.

In some instances, an alarm, a warning, and/or some other indication may be output to the operator when certain conditions are met. The conditions may include a total accumulated damage that exceeds a predetermined threshold and/or a through fault counter that exceeds a predetermined threshold. The total accumulated damage and the through fault counter may be assessed for each phase.

In some instances, the condition of the power transformer system may be indicative of an amount of total accumulated damage to the power transformer system. The total accumulated damage may be a cumulative damage that accounts for damage caused by previous through faults. The amount of total accumulated damage may be assessed differently based on the category of the transformer. For example, depending on the frequency of the through faults, only the thermal state change may be used to assess the cumulative state change, instead of both the mechanical state change and the thermal state change. The amount of total accumulated damage may also be assessed differently depending on the total accumulated damage or the total accumulated damage per phase. For example, if the total accumulated damage or the total accumulated damage per phase is below a predetermined threshold, only the thermal state change may be used to assess the cumulative state change, instead of both the mechanical state change and the thermal state change.

At block 214, a fleet ranking may be updated based on the power transformer risk index. The fleet ranking may be an organizational system to classify various power transformers in a system based on their respective power transformer risk indexes.

Figure 3:
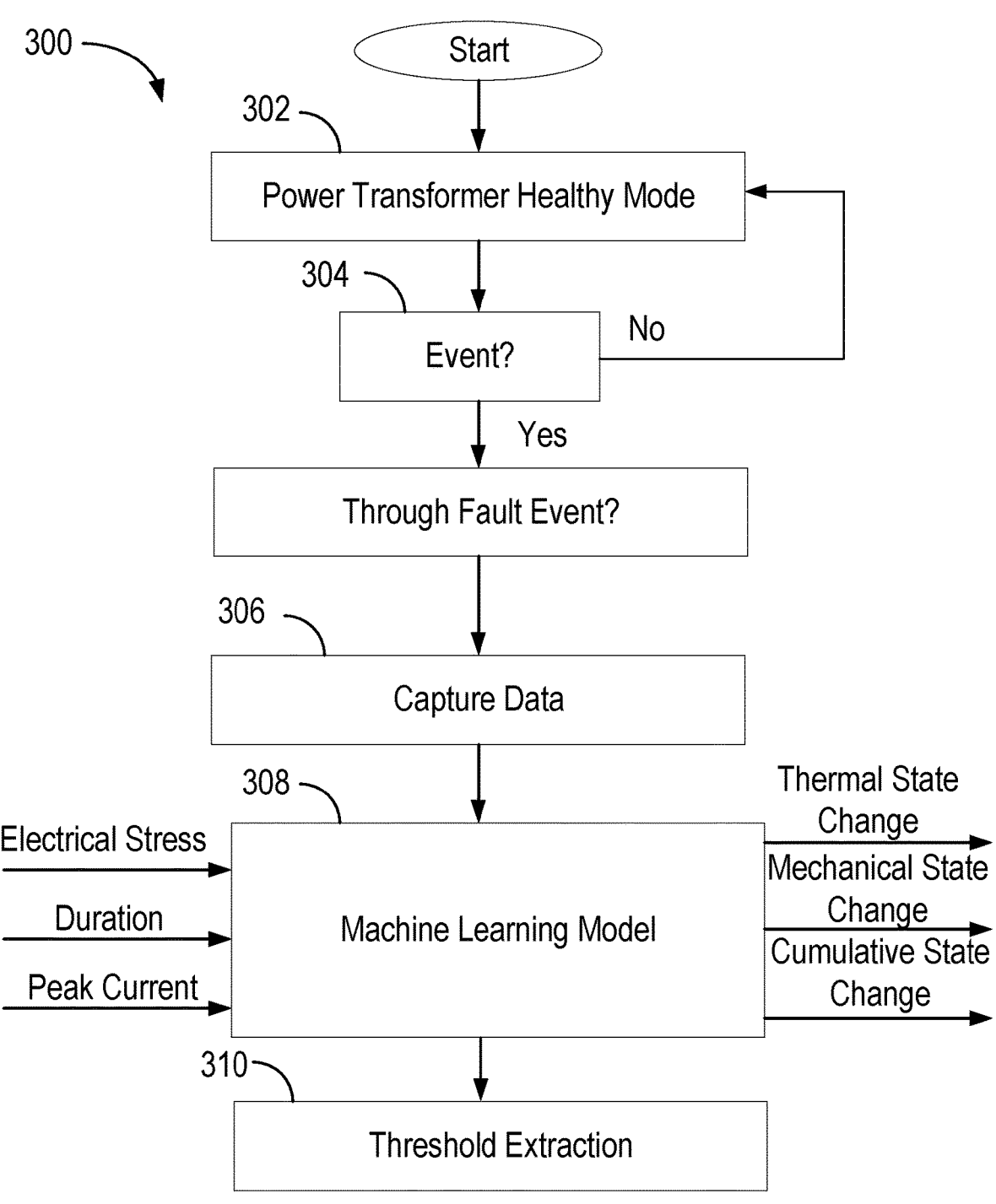
FIG. 3 is a flow chart depicting a method for monitoring a through fault current, in accordance with one or more example embodiments of the disclosure.

FIG. 3 is a flow chart 300 of a method for monitoring a through fault current. At block 302, the power transformer is commissioned to operate in a healthy mode. At block 304, the power transformer system evaluates if an event has occurred. If no event is detected to have occurred, the power transformer continues to operate in a healthy mode. If an event is detected to have occurred, the power transformer system then determines if the event is a through fault. If the event is a through fault, at block 306, the following data may be captured: a dissolved gas analysis, a rate of change, a gas ratio, a winding hot spot temperature or thermal output, an aging factor, a loss of life, an electrical stress, and/or other applicable data. The captured data may then be used as an input to a machine learning model 308. During the through fault, the power transformer system may further evaluate the electrical stress during the through fault, the duration of the through fault, and a peak current associated with the through fault. The electrical stress, the duration, and the peak current may also be used as an input to the machine learning model 308.

The machine learning model 308 may then correlate the data inputs and output a thermal state change, a mechanical state change, and a cumulative state change. At block 310, the machine learning model 308 may be used for statistical analysis and to extract thresholds associated with the power transformer. For example, thresholds may pertain to any applicable variable, such as electrical stress, peak current, thermal state change, mechanical state change, cumulative state change, power transformer condition, dissolved gas analysis, rate of change, gas ratio, winding hot spot temperature or thermal output, aging factor, loss of life, or any other relevant variable.

7

Figure 4:
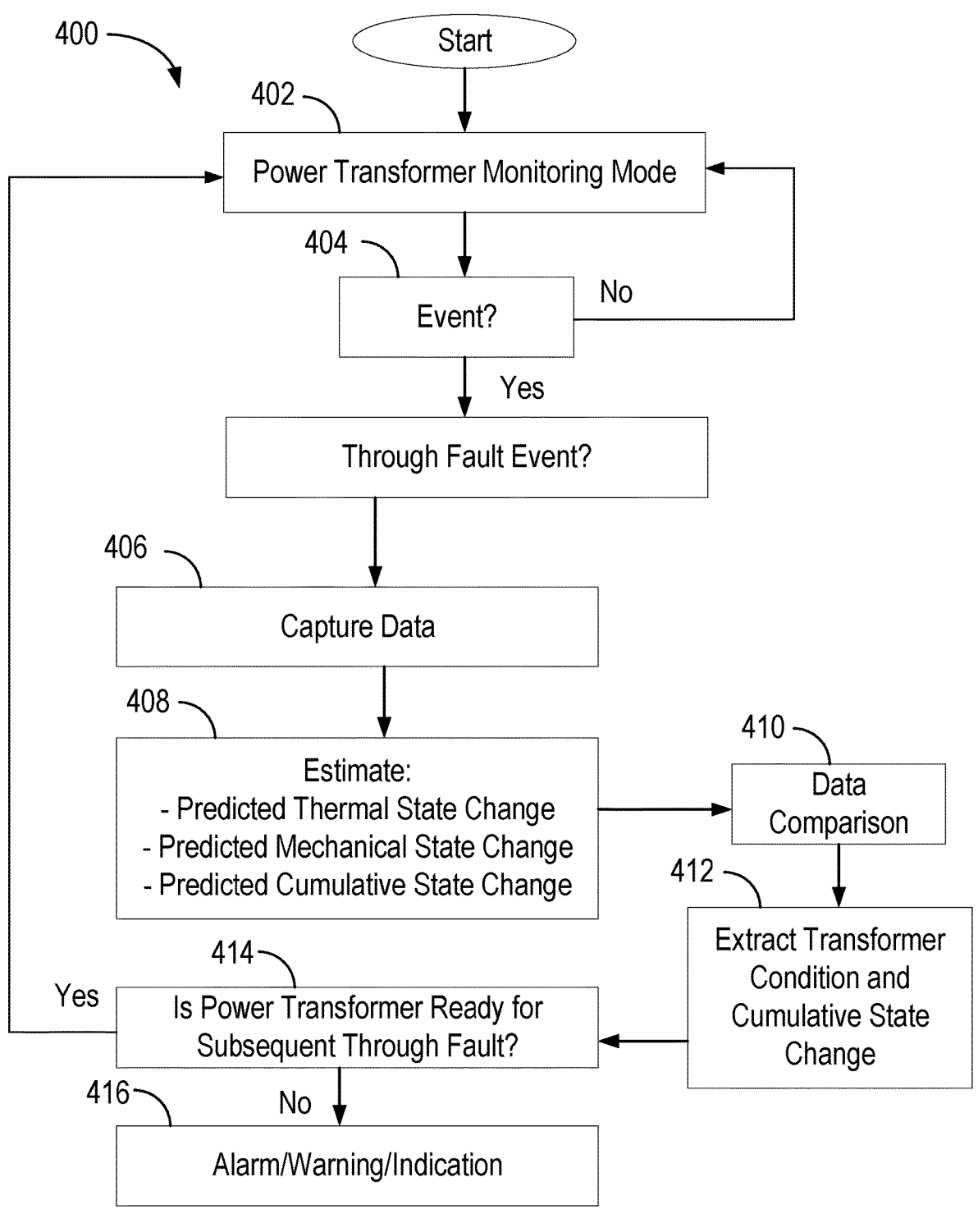
FIG. 4 is a flow chart depicting a method for monitoring a through fault current, in accordance with one or more example embodiments of the disclosure.

FIG. 4 is a flow chart 400 of a method for monitoring a through fault current. At block 402, the power transformer is commissioned to operate in a monitoring mode. At block 404, the power transformer system evaluates if an event has occurred. If no event is detected to have occurred, the power transformer continues to operate in a monitoring mode. If an event is detected to have occurred, the power transformer system then determines if the event is a through fault. If the event is a through fault, at block 406, the following data may be captured: a dissolved gas analysis, a rate of change, a gas ratio, a winding hot spot temperature or thermal output, an aging factor, a loss of life, an electrical stress, and/or other applicable data. The captured data may then be used as an input to the machine learning model. At block 408, the machine learning model may then be used to estimate a predicted thermal state change, a predicted mechanical state change, and a predicted cumulative state change.

During the through fault, the power transformer system may further evaluate the electrical stress during the through fault, the duration of the through fault, and a peak current associated with the through fault. The captured data, the electrical stress, the duration of the through fault, and the peak current associated with the through fault may then be used to calculate a thermal state change, a mechanical state change, and a cumulative state change. At block 410, the calculated thermal state change, the calculated mechanical state change, and the calculated cumulative state change may be compared to the predicted thermal state change, the predicted mechanical state change, and the predicted cumulative state change. Additionally, at block 410, the captured data, the electrical stress, the peak current associated with the through fault, and the duration of the through fault may be compared to predefined thresholds, such as the thresholds as determined in accordance with FIG. 3. At block 412, the condition of the power transformer and the cumulative state change may be extracted based on the comparisons performed at block 410. At block 414, the power transformer system may determine if the power transformer is prepared for another through fault based on the power transformer condition and the cumulative state change. If the power transformer system is prepared for another through fault, the power transformer may continue operating in a monitoring mode. If the power transformer system is not prepared for another through fault, an alarm or warning or indication may be provided to an operator at block 414.

It should be apparent that the foregoing relates only to certain embodiments of this application and resultant patent. Numerous changes and modifications may be made herein by one of ordinary skill in the art without departing from the general spirit and scope of the invention as defined by the following claims and the equivalents thereof.

Further aspects of the invention are provided by the subject matter of the following clauses:

1. A method for monitoring a through fault current, comprising: detecting a first occurrence of a first through fault in a power transformer system; calculating a first electrical stress associated with the first through fault, a first peak current associated with the first through fault, and a first duration of the first through fault; determining a first set of percentage state changes associated with the first through fault and a second set of percentage state changes associated with the first through fault; assigning a first set of weights and a first set of criticalities to the first set of percentage state changes; calculating a first mechanical state change based at least in part on the first set of percentage state changes, the first set of weights, and the first set of criticalities; assigning a second set of weights and a second set of criticalities to the second set of percentage state changes; calculating a first thermal state change based at least in part on the second set of percentage state changes, the second set of weights, and the second set of criticalities; calculating a first cumulative state change based at least in part on the first mechanical state change and the first thermal state change; and training a machine learning model using the first electrical stress, the first peak current, the first duration, the first set of percentage state changes, the second set of percentage state changes, the first mechanical state change, the first thermal state change, and the first cumulative state change.

2. The method of clause 1, wherein the first set of percentage state changes comprises at least a first percentage state change associated with a dissolved gas analysis, a second percentage state change associated with a rate of change, and a third percentage state change associated with a gas ratio.

3. The method of any preceding clause, wherein the second set of percentage state changes comprises at least a fourth percentage state change associated with a winding hot spot temperature or thermal output, a fifth percentage state change associated with an aging factor, and a sixth percentage state change associated with a loss of life.

4. The method of any preceding clause, wherein the machine learning model is trained when the power transformer system is in a healthy mode.

5. The method of any preceding clause, wherein determining the first set of percentage state changes associated with the first through fault and the second set of percentage state changes associated with the first through fault further comprises: identifying a set of mechanical measurements associated with the power transformer system and a set of thermal measurements associated with the power transformer system; determining a respective condition associated with each mechanical measurement of the set of mechanical measurements and each thermal measurement of the set of thermal measurements; and determining the first set of percentage state changes and the second set of percentage state changes based at least in part on the respective condition associated with the each mechanical measurement of the set of mechanical measurements and the each thermal measurement of the set of thermal measurements.

6. The method of any preceding clause, further comprising: detecting a second occurrence of a second through fault in the power transformer system; calculating a second electrical stress associated with the second through fault, a second peak current associated with the second through fault, and a second duration of the second through fault; determining a third set of percentage state changes associated with the second through fault and a fourth set of percentage state changes associated with the second through fault; calculating, based at least in part on the third set of percentage state changes and the fourth set of percentage state changes, a second mechanical state change associated with the second through fault, a second thermal state change associated with the second through fault, and a second cumulative state change with the second through fault; estimating, using the machine learning model, a third mechanical state change associated with the second through fault, a third thermal state change associated with the second through fault, and a third cumulative state change with the second through fault; and determining a condition of the power transformer system based at least in part on the second mechanical state change, the second thermal state change, the second cumulative state change, the third mechanical state change, the third thermal state change, and the third cumulative state change.

7. The method of any preceding clause, wherein determining the condition of the power transformer system based at least in part on the second mechanical state change, the second thermal state change, the second cumulative state change, the third mechanical state change, the third thermal state change, and the third cumulative state change further comprises: calculating a first difference between the second mechanical state change and the third mechanical state change; calculating a second difference between the second thermal state change and the third thermal state change; calculating a third difference between the second cumulative state change and the third cumulative state change; and determining the condition of the power transformer system based at least in part on the first difference, the second difference, and the third difference.

8. The method of any preceding clause, further comprising: determining, based at least in part on the condition of the power transformer system, that the power transformer system is unprepared for a third occurrence of a third through fault; and outputting an indication to an operator.

9. The method of any preceding clause, wherein the first occurrence of the first through fault is identified based at least in part on a plurality of circuit breaker statuses associated with the power transformer system.

10. A method for monitoring a through fault current, comprising: detecting a first occurrence of a first through fault in a power transformer system; calculating a first electrical stress associated with the first through fault, a first peak current associated with the first through fault, and a first duration of the first through fault; determining a first set of percentage state changes associated with the first through fault and a second set of percentage state changes associated with the first through fault; calculating a first mechanical state change based at least in part on the first set of percentage state changes; calculating a first thermal state change based at least in part on the second set of percentage state changes; calculating a first cumulative state change based at least in part on the first mechanical state change and the first thermal state change; and training a machine learning model using the first electrical stress, the first peak current, the first duration, the first set of percentage state changes, the second set of percentage state changes, the first mechanical state change, the first thermal state change, and the first cumulative state change.

11. The method of any preceding clause, further comprising: assigning a first set of weights and a first set of criticalities to the first set of percentage state changes; assigning a second set of weights and a second set of criticalities to the second set of percentage state changes; calculating the first mechanical state change based at least in part on the first set of percentage state changes, the first set of weights, and the first set of criticalities; and calculating the first thermal state change based at least in part on the second set of percentage state changes, the second set of weights, and the second set of criticalities.

12. The method of any preceding clause, wherein the first set of percentage state changes comprises at least a first percentage state change associated with a dissolved gas analysis, a second percentage state change associated with a rate of change, and a third percentage state change associated with a gas ratio.

13. The method of any preceding clause, wherein the second set of percentage state changes comprises at least a fourth percentage state change associated with a winding hot spot temperature or thermal output, a fifth percentage state change associated with an aging factor, and a sixth percentage state change associated with a loss of life.

14. The method of any preceding clause, wherein determining the first set of percentage state changes associated with the first through fault and the second set of percentage state changes associated with the first through fault further comprises: identifying a set of mechanical measurements associated with the power transformer system and a set of thermal measurements associated with the power transformer system; determining a respective condition associated with each mechanical measurement of the set of mechanical measurements and each thermal measurement of the set of thermal measurements; and determining the first set of percentage state changes and the second set of percentage state changes based at least in part on the respective condition associated with the each mechanical measurement of the set of mechanical measurements and the each thermal measurement of the set of thermal measurements.

15. The method of any preceding clause, further comprising: detecting a second occurrence of a second through fault in the power transformer system; calculating a second electrical stress associated with the second through fault, a second peak current associated with the second through fault, and a second duration of the second through fault; determining a third set of percentage state changes associated with the second through fault and a fourth set of percentage state changes associated with the second through fault; calculating, based at least in part on the third set of percentage state changes and the fourth set of percentage state changes, a second mechanical state change associated with the second through fault, a second thermal state change associated with the second through fault, and a second cumulative state change with the second through fault; estimating, using the machine learning model, a third mechanical state change associated with the second through fault, a third thermal state change associated with the second through fault, and a third cumulative state change with the second through fault; and determining a condition of the power transformer system based at least in part on the second mechanical state change, the second thermal state change, the second cumulative state change, the third mechanical state change, the third thermal state change, and the third cumulative state change.

16. The method of any preceding clause, wherein determining a condition of the power transformer system based at least in part on the second mechanical state change, the second thermal state change, the second cumulative state change, the third mechanical state change, the third thermal state change, and the third cumulative state change further comprises: calculating a first difference between the second mechanical state change and the third mechanical state change; calculating a second difference between the second thermal state change and the third thermal state change; calculating a third difference between the second cumulative state change and the third cumulative state change; and determining the condition of the power transformer system based at least in part on the first difference, the second difference, and the third difference.

17. A power transformer system, comprising: a power transformer; and a controller, wherein the controller is configured to: detect a first occurrence of a first through fault in the power transformer system; calculate a first electrical stress associated with the first through fault, a first peak current associated with the first through fault, and a first duration of the first through fault; determine a first set of percentage state changes associated with the first through fault and a second set of percentage state changes associated with the first through fault; assign a first set of weights and a first set of criticalities to the first set of percentage state changes; calculate a first mechanical state change based at least in part on the first set of percentage state changes, the first set of weights, and the first set of criticalities; assign a second set of weights and a second set of criticalities to the second set of percentage state changes; calculate a first thermal state change based at least in part on the second set of percentage state changes, the second set of weights, and the second set of criticalities; calculate a first cumulative state change based at least in part on the first mechanical state change and the first thermal state change; and train a machine learning model using the first electrical stress, the first peak current, the first duration, the first set of percentage state changes, the second set of percentage state changes, the first mechanical state change, the first thermal state change, and the first cumulative state change.

18. The power transformer system of any preceding clause, wherein the first set of percentage state changes comprises at least a first percentage state change associated with a dissolved gas analysis, a second percentage state change associated with a rate of change, and a third percentage state change associated with a gas ratio.

19. The power transformer system of any preceding clause, wherein the second set of percentage state changes comprises at least a fourth percentage state change associated with a winding hot spot temperature or thermal output, a fifth percentage state change associated with an aging factor, and a sixth percentage state change associated with a loss of life.

20. The power transformer system of any preceding clause, wherein the determination of the first set of percentage state changes associated with the first through fault and the second set of percentage state changes associated with the first through fault further comprises: identifying a set of mechanical measurements associated with the power transformer system and a set of thermal measurements associated with the power transformer system; determining a respective condition associated with each mechanical measurement of the set of mechanical measurements and each thermal measurement of the set of thermal measurements; and determining the first set of percentage state changes and the second set of percentage state changes based at least in part on the respective condition associated with the each mechanical measurement of the set of mechanical measurements and the each thermal measurement of the set of thermal measurements.

We claim:
1. A method for monitoring a through fault current, comprising:
   detecting a first occurrence of a first through fault in a power transformer system;
   calculating a first electrical stress associated with the first through fault, a first peak current associated with the first through fault, and a first duration of the first through fault;
   determining a first set of percentage state changes in the power transformer system and associated with the first through fault and a second set of percentage state changes in the power transformer system and associated with the first through fault;
   assigning a first set of weights and a first set of criticalities to the first set of percentage state changes;
   calculating a first mechanical state change in the power transformer system and based at least in part on the first set of percentage state changes, the first set of weights, and the first set of criticalities;
   assigning a second set of weights and a second set of criticalities to the second set of percentage state changes;
   calculating a first thermal state change in the power transformer system and based at least in part on the second set of percentage state changes, the second set of weights, and the second set of criticalities;
   calculating a first cumulative state change in the power transformer system and based at least in part on the first mechanical state change and the first thermal state change;
   training a machine learning model using the first electrical stress, the first peak current, the first duration, the first set of percentage state changes, the second set of percentage state changes, the first mechanical state change, the first thermal state change, and the first cumulative state change;
   extracting an operational threshold for the power transform system based on the trained machine learning model, wherein the operational threshold is indicative of whether the power transform system is prepared for another through fault; and
   causing the power transformer system to switch from a monitoring mode to an alarm mode based on determining that operational data for the power transform system exceeds the operational threshold.

2. The method of claim 1, wherein the first set of percentage state changes comprises at least a first percentage state change associated with a dissolved gas analysis, a second percentage state change associated with a rate of change, and a third percentage state change associated with a gas ratio.

3. The method of claim 2, wherein the second set of percentage state changes comprises at least a fourth percentage state change associated with a winding hot spot temperature or thermal output, a fifth percentage state change associated with an aging factor, and a sixth percentage state change associated with a loss of life.

4. The method of claim 1, wherein the machine learning model is trained when the power transformer system is in a healthy mode.

5. The method of claim 1, wherein determining the first set of percentage state changes associated with the first through fault and the second set of percentage state changes associated with the first through fault further comprises:

identifying a set of mechanical measurements associated with the power transformer system and a set of thermal measurements associated with the power transformer system;

determining a respective condition associated with each mechanical measurement of the set of mechanical measurements and each thermal measurement of the set of thermal measurements; and determining the first set of percentage state changes and the second set of percentage state changes based at least in part on the respective condition associated with the each mechanical measurement of the set of mechanical measurements and the each thermal measurement of the set of thermal measurements.

6. The method of claim 1, further comprising:

detecting a second occurrence of a second through fault in the power transformer system;

calculating a second electrical stress associated with the second through fault, a second peak current associated with the second through fault, and a second duration of the second through fault;

determining a third set of percentage state changes in the power transformer system and associated with the second through fault and a fourth set of percentage state changes associated with the second through fault;

calculating, based at least in part on the third set of percentage state changes and the fourth set of percentage state changes, a second mechanical state change in the power transformer system and associated with the second through fault, a second thermal state change associated with the second through fault, and a second cumulative state change with the second through fault;

estimating, using the machine learning model, a third mechanical state change in the power transformer system and associated with the second through fault, a third thermal state change associated with the second through fault, and a third cumulative state change in the power transformer system and associated with the second through fault; and determining a condition of the power transformer system based at least in part on the second mechanical state change, the second thermal state change, the second cumulative state change, the third mechanical state change, the third thermal state change, and the third cumulative state change.

7. The method of claim 6, wherein determining the condition of the power transformer system based at least in part on the second mechanical state change, the second thermal state change, the second cumulative state change, the third mechanical state change, the third thermal state change, and the third cumulative state change further comprises:

calculating a first difference between the second mechanical state change and the third mechanical state change;

calculating a second difference between the second thermal state change and the third thermal state change;

calculating a third difference between the second cumulative state change and the third cumulative state change; and determining the condition of the power transformer system based at least in part on the first difference, the second difference, and the third difference.

8. The method of claim 6, further comprising:

outputting an indication to an operator based on the alarm mode.

9. The method of claim 1, wherein the first occurrence of the first through fault is identified based at least in part on a plurality of circuit breaker statuses associated with the power transformer system.

10. A method for monitoring a through fault current, comprising:

detecting a first occurrence of a first through fault in a power transformer system;

calculating a first electrical stress associated with the first through fault, a first peak current associated with the first through fault, and a first duration of the first through fault;

determining a first set of percentage state changes in the power transformer system and associated with the first through fault and a second set of percentage state changes in the power transformer system and associated with the first through fault;

calculating a first mechanical state change in the power transformer system and based at least in part on the first set of percentage state changes;

calculating a first thermal state change in the power transformer system and based at least in part on the second set of percentage state changes;

calculating a first cumulative state change in the power transformer system and based at least in part on the first mechanical state change and the first thermal state change;

training a machine learning model using the first electrical stress, the first peak current, the first duration, the first set of percentage state changes, the second set of percentage state changes, the first mechanical state change, the first thermal state change, and the first cumulative state change;

extracting an operational threshold for the power transform system based on the trained machine learning model, wherein the operational threshold is indicative of whether the power transform system is prepared for another through fault; and causing the power transformer system to switch from a monitoring mode to an alarm mode based on determining that operational data for the power transform system exceeds the operational threshold.

11. The method of claim 10, further comprising:

assigning a first set of weights and a first set of criticalities to the first set of percentage state changes;

assigning a second set of weights and a second set of criticalities to the second set of percentage state changes;

calculating the first mechanical state change based at least in part on the first set of percentage state changes, the first set of weights, and the first set of criticalities; and calculating the first thermal state change based at least in part on the second set of percentage state changes, the second set of weights, and the second set of criticalities.

12. The method of claim 10, wherein the first set of percentage state changes comprises at least a first percentage state change associated with a dissolved gas analysis, a second percentage state change associated with a rate of change, and a third percentage state change associated with a gas ratio.

13. The method of claim 12, wherein the second set of percentage state changes comprises at least a fourth percentage state change associated with a winding hot spot temperature or thermal output, a fifth percentage state change associated with an aging factor, and a sixth percentage state change associated with a loss of life.

14. The method of claim 10, wherein determining the first set of percentage state changes associated with the first through fault and the second set of percentage state changes associated with the first through fault further comprises:

identifying a set of mechanical measurements associated with the power transformer system and a set of thermal measurements associated with the power transformer system;

determining a respective condition in the power transformer system and associated with each mechanical measurement of the set of mechanical measurements and each thermal measurement of the set of thermal measurements; and determining the first set of percentage state changes and the second set of percentage state changes based at least in part on the respective condition associated with the each mechanical measurement of the set of mechanical measurements and the each thermal measurement of the set of thermal measurements.

15. The method of claim 10, further comprising:

detecting a second occurrence of a second through fault in the power transformer system;

calculating a second electrical stress associated with the second through fault, a second peak current associated with the second through fault, and a second duration of the second through fault;

determining a third set of percentage state changes in the power transformer system and associated with the second through fault and a fourth set of percentage state changes in the power transformer system and associated with the second through fault;

calculating, based at least in part on the third set of percentage state changes and the fourth set of percentage state changes, a second mechanical state change in the power transformer system and associated with the second through fault, a second thermal state change in the power transformer system and associated with the second through fault, and a second cumulative state change in the power transformer system and with the second through fault;

estimating, using the machine learning model, a third mechanical state change in the power transformer system and associated with the second through fault, a third thermal state change in the power transformer system and associated with the second through fault, and a third cumulative state change in the power transformer system and with the second through fault; and determining a condition of the power transformer system based at least in part on the second mechanical state change, the second thermal state change, the second cumulative state change, the third mechanical state change, the third thermal state change, and the third cumulative state change.

16. The method of claim 15, wherein determining a condition of the power transformer system based at least in part on the second mechanical state change, the second thermal state change, the second cumulative state change, the third mechanical state change, the third thermal state change, and the third cumulative state change further comprises:

calculating a first difference between the second mechanical state change and the third mechanical state change;

calculating a second difference between the second thermal state change and the third thermal state change;

16 calculating a third difference between the second cumulative state change and the third cumulative state change; and determining the condition of the power transformer system based at least in part on the first difference, the second difference, and the third difference.

17. A power transformer system, comprising:

a power transformer; and a controller, wherein the controller is configured to:

detect a first occurrence of a first through fault in the power transformer system;

calculate a first electrical stress associated with the first through fault, a first peak current associated with the first through fault, and a first duration of the first through fault;

determine a first set of percentage state changes in the power transformer system and associated with the first through fault and a second set of percentage state changes in the power transformer system and associated with the first through fault;

assign a first set of weights and a first set of criticalities to the first set of percentage state changes;

calculate a first mechanical state change based at least in part on the first set of percentage state changes, the first set of weights, and the first set of criticalities;

assign a second set of weights and a second set of criticalities to the second set of percentage state changes;

calculate a first thermal state change in the power transformer system and based at least in part on the second set of percentage state changes, the second set of weights, and the second set of criticalities;

calculate a first cumulative state change in the power transformer system and based at least in part on the first mechanical state change and the first thermal state change;

train a machine learning model using the first electrical stress, the first peak current, the first duration, the first set of percentage state changes, the second set of percentage state changes, the first mechanical state change, the first thermal state change, and the first cumulative state change;

extract an operational threshold for the power transform system based on the trained machine learning model, wherein the operational threshold is indicative of whether the power transform system is prepared for another through fault; and cause the power transformer system to switch from a monitoring mode to an alarm mode based on determining that operational data for the power transform system exceeds the operational threshold.

18. The power transformer system of claim 17, wherein the first set of percentage state changes comprises at least a first percentage state change associated with a dissolved gas analysis, a second percentage state change associated with a rate of change, and a third percentage state change associated with a gas ratio.

19. The power transformer system of claim 18, wherein the second set of percentage state changes comprises at least a fourth percentage state change associated with a winding hot spot temperature or thermal output, a fifth percentage state change associated with an aging factor, and a sixth percentage state change associated with a loss of life.

20. The power transformer system of claim 17, wherein the determination of the first set of percentage state changes associated with the first through fault and the second set of percentage state changes associated with the first through fault further comprises:

identifying a set of mechanical measurements associated with the power transformer system and a set of thermal measurements associated with the power transformer system;

determining a respective condition associated with each mechanical measurement of the set of mechanical measurements and each thermal measurement of the set of thermal measurements; and determining the first set of percentage state changes and the second set of percentage state changes based at least in part on the respective condition associated with the each mechanical measurement of the set of mechanical measurements and the each thermal measurement of the set of thermal measurements.

* * * * *